United States Patent
Alok

(10) Patent No.: US 6,303,508 B1
(45) Date of Patent: Oct. 16, 2001

(54) SUPERIOR SILICON CARBIDE INTEGRATED CIRCUITS AND METHOD OF FABRICATING

(75) Inventor: Dev Alok, Danbury, CT (US)

(73) Assignee: Philips Electronics North America Corporation, New York, NY (US)

( * ) Notice: Subject to any disclaimer, the term of this patent is extended or adjusted under 35 U.S.C. 154(b) by 0 days.

(21) Appl. No.: 09/464,861

(22) Filed: Dec. 16, 1999

(51) Int. Cl.$^7$ .................................................. H01L 21/302

(52) U.S. Cl. .......................... 438/705; 438/486; 438/305

(58) Field of Search .................................... 438/368, 931, 438/166, 365, 478, 482, 486, 705

(56) References Cited

U.S. PATENT DOCUMENTS

| | | | |
|---|---|---|---|
| 4,818,732 | * 4/1989 | Fox et al. | 501/81 |
| 5,270,244 | 12/1993 | Baliga | 437/67 |
| 5,318,915 | 6/1994 | Baliga et al. | 437/24 |
| 5,322,802 | 6/1994 | Baliga et al. | 437/22 |
| 5,338,945 | 8/1994 | Baliga et al. | 257/77 |
| 5,406,096 | 4/1995 | Malhi | 257/114 |
| 5,436,174 | 7/1995 | Baliga et al. | 437/22 |
| 5,449,925 | 9/1995 | Baliga et al. | 257/77 |
| 5,543,637 | 8/1996 | Baliga | 257/77 |

FOREIGN PATENT DOCUMENTS

| | | | |
|---|---|---|---|
| 2306250A | 4/1997 | (GB) | H01L/29/78 |
| 55-24482A | 2/1980 | (JP) | H01L/21/205 |
| 62-252968 | * 11/1987 | (JP) . | |
| 07082098A | 3/1995 | (JP) | C30B/33/00 |

OTHER PUBLICATIONS

"A Novel Method for Etching Trenches in Silicon Carbide", by Dev Alok et al., Journal of Electronic Materials, vol. 24, No. 4, 1995, pp. 311–314.

* cited by examiner

Primary Examiner—John F. Niebling
Assistant Examiner—Christopher Lattin
(74) Attorney, Agent, or Firm—Ernestine C. Bartlett

(57) ABSTRACT

The present invention provides semiconductor devices having at least one silicon region in a silicon carbide wafer in which is fabricated a low voltage semiconductor device such as for example, MOSFET devices, BiCMOS devices, Bipolar devices, etc., and on the same chip, at least one silicon carbide region in which is fabricated a high voltage (i.e., >1000V) semiconductor device using techniques well known in the art, such as for example, LDMOSFET, UMOSFET, DMOSFET, IGBT, MESFET, and JFET devices. Such devices are derived from a method for forming a silicon region on a silicon carbide substrate which comprises the steps of: providing a monocrystalline silicon carbide substrate; amorphizing at least one region of the substrate, preferably by subjecting at least a portion of a surface of the substrate to ion implantation to convert at least a portion of the substrate surface to amorphous silicon carbide producing a region of amorphous silicon carbide on a monocrystalline silicon carbide substrate; removing at least an effective amount of carbon from said amorphized region, preferably by subjecting at least a portion of the amorphous silicon carbide region to an etchant material which selectively removes carbon to produce a region of amorphous silicon on a monocrystalline silicon carbide substrate; and subjecting the monocrystalline substrate with at least a region of amorphous silicon to high temperature thermal anneal to produce a region of monocrystalline silicon on said monocrystalline silicon carbide substrate.

9 Claims, 2 Drawing Sheets

SUPERIOR SILICON CARBIDE INTEGRATED CIRCUITS AND METHOD OF FABRICATING

FIELD OF THE INVENTION

This invention relates to superior silicon carbide integrated circuits and to methods for fabricating the same.

RELATED APPLICATION

This invention is related to my invention set forth in co-pending Ser. No. 09/464,862, "Method of Achieving High Inversion Layer Mobility In Novel Silicon Carbide Semiconductor Devices", filed concurrently herewith, which application subject matter is hereby incorporated herein by reference.

BACKGROUND OF THE INVENTION

Silicon carbide is known to be a superior semiconductor material for high voltage and high frequency applications. The high voltage capability of SiC is due to its large critical electric field ($2 \times 10^6$ V/cm), which is about 10 times higher than that of silicon. The SiC high voltage devices are expected to have 200 times smaller power loss when compared to a similarly rated Si device. SiC MOSFETs are expected to replace Si IGBTs and GTOs. However, the performance of low voltage, low power SiC devices is expected to be inferior to that of existing Si CMOS devices. The reason for this is: (1) the mobility of carriers in SiC is smaller than that in Si; and (2) the device technology of SiC is less mature than that of Si, which forces the feature size and power losses to be higher for low voltage SiC devices. There is increasing interest in providing a high voltage semiconductor device and a low voltage semiconductor device in a monolithic, same chip integrated circuit structure and particularly such a device on silicon carbide.

Additionally, silicon carbide is chemically inert in nature and is not attacked by most of the common etchants at room temperature due to the strong bond between carbon and silicon in monocrystalline silicon carbide. At the same time, the bonds between silicon and carbon in amorphous silicon carbide are weak. In my work with B. J. Baliga, it was reported that monocrystalline silicon carbide is not attacked by most of the common laboratory etchants, such as HF, $HNO_3$, KOH, HCl, etc. while amorphous silicon carbide can be etched by treating it as a mixture of silicon and carbon. See Alok et al, Journal of Electronic Materials, Vol. 24, No. 4, pp. 311–314 and the similar disclosure of U.S. Pat. No. 5,436,174 wherein this fact is used to form trenches in a monocrystalline silicon substrate by directing first electrically inactive ions using ion-implantation into a first portion of the monocrystalline silicon carbide substrate to create an amorphous silicon carbide region followed by removal of the first amorphous silicon carbide region to form a trench in the monocrystalline silicon carbide using an etchant which selectively etches amorphous silicon carbide at a higher rate than monocrystalline silicon carbide.

U.S. Pat. Nos. 5,318,915, 5,322,802, 5,436,174, and 5,449,925 disclose procedures which use amorphization to create deep PN junctions or deep trenches in SiC wafers. However, these references do not produce integrated circuits that combine the advantages of silicon carbide and silicon, and do not provide for improvement in speed and performance of integrated circuits. Other workers in the art (JPA 55024482 and JPA 07082098) have attempted to create SiC areas in a Si wafer by converting a thin layer of Si into SiC using ion implantation. Such thin layers cannot be used to create high voltage (>1000V) power devices. Moreover, attempts in our laboratory to convert part of a Si wafer to SiC using high temperature ion implantation have been unsuccessful. There is a continued need in the art for integrated circuits that combine the excellent inversion layer mobility properties of silicon with the superior properties of silicon carbide for high voltage and high frequency applications and that comprise silicon low voltage devices and silicon carbide high voltage devices on a single chip.

SUMMARY OF THE INVENTION

An object of the invention is to provide novel silicon carbide devices in which low voltage semiconductor devices are fabricated in silicon regions on a silicon carbide substrate and in which high voltage lateral and/or vertical devices are fabricated in silicon carbide regions of the same silicon carbide substrate.

Another object of the invention is to provide such silicon carbide devices fabricated as a monolithic integrated circuit.

These and other objects of the invention will be apparent from the description of the invention that follows.

In my co-pending application Ser. No. 09/464,862, referred to above, a method is described and claimed for the production of silicon carbide devices which have an oxide region on (a) either an amorphous silicon-rich region which is (i) predominantly or entirely amorphous silicon or (ii) a mixture of predominantly amorphous silicon in combination with amorphous silicon carbide and/or silicon dioxide or (b) a monocrystalline silicon region;

wherein (a) or (b) is present on a region of a silicon carbide substrate, or (c) a region of a silicon carbide substrate, and to novel silicon carbide devices derived therefrom.

In one specific embodiment, the method includes the steps of:

(a) amorphizing silicon carbide in at least one region of a monocrystalline silicon carbide substrate by ion implantation to break the Si-C bonds and convert the silicon carbide to amorphous silicon carbide;

(b) removing at least an effective amount of the carbon from the resulting amorphous silicon carbide with an etchant effective to selectively remove said effective amount of carbon from said amorphous silicon carbide to produce an amorphous silicon-rich region; and (c) forming an oxide on said amorphous silicon-rich region, preferably by subjecting the etched region to thermal oxidation under conditions effective to preserve the amorphous silicon layer; or subjecting the etched region to thermal oxide under conditions that substantially remove the amorphous silicon layer; or subjecting the etched region to thermal oxidation to produce an oxide on an amorphous silicon layer and annealing to produce an oxide on monocrystalline silicon on a region of a silicon carbide substrate; or by first growing LTO on the etched region and then subjecting the LTO-bearing etched region to thermal oxidation and high temperature anneal to produce an LTO oxide on a monocrystalline silicon carbide substrate.

Thus, the inventive method reduces the interface states density and improves the inversion layer mobility by removing an effective amount of carbon from silicon carbide as described above and wherein the term "effective amount" means that amount of carbon which when removed or that amount of silicon carbide which when amorphized and etched according to the invention is effective to reduce the interface states density between the silicon carbide region and the oxide region and thereby result in an improvement of the inversion layer mobility when compared to interface states density and inversion layer mobility of the unamorphized and/or unetched silicon carbide and/or that amount which when removed is effective to permit the formation of a substantially crystalline silicon region from an amorphous silicon carbide region.

In such method, the carbon need only be removed from the top surface as that is the only silicon carbide region which would be consumed during the oxidation process. However, the invention is not restricted to amorphization and removal of carbon from only the surface nor to treatment of any particular area of a substrate. Rather the invention contemplates a technique which selectively removes carbon from a selected region(s) of a silicon substrate, such as a silicon carbide wafer. Once the carbon is removed, thermal oxidation can be performed to provide a device having reduced interface states between the silicon carbide and thermal oxide. The method makes it possible to increase inversion layer mobility in SiC MOS devices. These MOSFET devices are useful as SiC high voltage (>1000V) ICs and may be used for a variety of commercial and military applications such as in locomotives, electric cars, combat vehicles, aircraft, lighting, etc.

This technology is also used in my present work, wherein it is desired to provide a superior class of high voltage integrated circuits (ICs) wherein silicon regions, preferably silicon islands, are formed in selective areas of SiC wafers. In such devices, it is possible to utilize SiC regions for the fabrication of devices requiring high voltage blocking capability, while using Si regions for fabrication of high speed logic and protection circuitry, i.e. low voltage power devices. It is desirable to have both Si and SiC regions on the same wafer for fabrication of high voltage devices accompanied with low voltage logic and control circuitry on the same chip. Fabrication of both high voltage and low voltage devices in the same semiconductor material leads to lower power loss and higher efficiency. It is therefore desirable to have both silicon and silicon carbide regions on the same wafer for fabrication of low and high voltage devices, respectively. This new class of integrated circuit yields lowest forward voltage drop when compared to Si or SiC power ICs.

The present invention provides at least one silicon region in a silicon carbide wafer in which may be fabricated a low voltage semiconductor device using techniques well known in the art, such as for example, MOSFET devices, BiCMOS devices, Bipolar devices, etc., and on the same chip, at least one silicon carbide region in which may be fabricated a high voltage (i.e., >1000V) semiconductor device using techniques well known in the art, such as for example, LDMOSFET, UMOSFET, DMOSFET, IGBT, MESFET, and JFET devices.

Such devices may be fabricated using any of the procedures described in said Docket No. PHA 23,882 provided the steps are conducted to provide a substantially monocrystalline silicon region on a silicon wafer. Another method for forming said silicon regions is described hereinbelow with respect to FIG. 3.

DETAILED DESCRIPTION OF THE PREFERRED EMBODIMENTS

Figure 3:
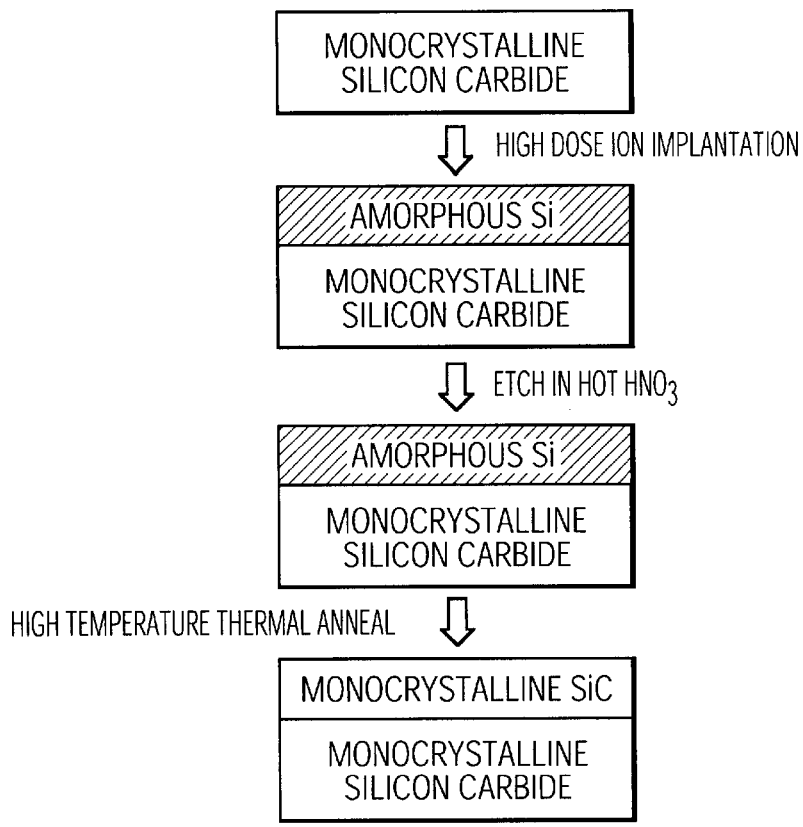
FIG. 3 is a flow diagram illustrating a process of the invention.

With reference to FIG. 3, there is illustrated a method for forming a silicon region on a silicon carbide substrate which comprises the steps of:

(1) providing a monocrystalline silicon carbide substrate;

(2) amorphizing at least one region of the substrate, preferably by subjecting at least a portion of a surface of the substrate to ion implantation to convert at least a portion of the substrate surface to amorphous silicon carbide producing a region of amorphous silicon carbide on a monocrystalline silicon carbide substrate;

(3) removing at least an effective amount of carbon from said amorphized region, preferably by subjecting at least a portion of the amorphous silicon carbide region to an etchant material which selectively removes carbon to produce a region of amorphous silicon on a monocrystalline silicon carbide substrate; and (4) subjecting the monocrystalline substrate with at least a region of amorphous silicon to high temperature thermal anneal to produce a region of monocrystalline silicon on said monocrystalline silicon carbide substrate.

The amorphization of silicon carbide in monocrystalline silicon carbide may be accomplished by any means effective to break the silicon to carbon bond and convert the monocrystalline silicon carbide to amorphous silicon carbide. Preferably the amorphizing step comprises implanting ions into a portion of the monocrystalline silicon substrate, such that the implanted ions convert the portion of the monocrystalline silicon carbide substrate into amorphous silicon carbide. Preferably, this is accomplished by high dose ion implantation. Amorphization of a substrate by ion-implantation requires exceeding a critical dose. The energy and atomic weight of the incident ion governs the depth of the amorphous layer. This can be done with a variety of implant species with implant dose higher than the critical implant dose. Table I gives the critical dose required to create an amorphous layer in SiC along with the maximum amorphous layer depth which can be achieved using a 200 KeV implanter for some of the commonly available implant species. Multiple energy implants may be required to create uniform amorphous layers from surface to the maximum depth listed in Table I.

TABLE I

Depth of amorphous region formed in SiC and the critical dose to obtain an amorphous layer using various impurities in a 200 keV implanter

| Implanted Species | Amorphous Layer (Å) | Critical Dose $(cm^{-2})$ |
|---|---|---|
| $Ar^{++}$ | 5000 | 7e14 |
| $Ar^{+}$ | 2100 | 5e14 |
| $Al^{+}$ | 3000 | 1e15 |
| $C^{++}$ | 6000 | 7e15 |
| $He^{+}$ | 9000 | 5e16 |

TABLE I-continued

Depth of amorphous region formed in SiC and the critical dose to obtain an amorphous layer using various impurities in a 200 keV implanter

| Implanted Species | Amorphous Layer (Å) | Critical Dose (cm$^{-2}$) |
|---|---|---|
| Si$^+$ | 2800 | 8e14 |
| H$^+$ | 15000 | 2e18 |
| Ne$^+$ | 4000 | 2e15 |

Ion implantation may take place through a mask which exposes an area on the silicon carbide substrate face. Ions are then directed to the face of the silicon carbide substrate such that the ions implant into the silicon carbide substrate through the exposed area. Multiple implants at different energies may be performed, for example, at a dose of 1×10$^{15}$ cm$^{-2}$ using a photoresist mask with 50, 130, 200 KeV singly charged ions and with 150, 200 KeV doubly charged ions. Once the bond between silicon and carbon is broken, the mask may be removed and the amorphized silicon carbide may be treated as a mixture of silicon and carbon. The carbon can then be removed by etching the amorphized region in a suitable etching agent, preferably hot HNO$_3$. After this, as indicated in said copending application, the etched sample can be subjected to thermal oxidation. For the present purposes, high temperature anneal will be conducted under conditions whereby the amorphous silicon region will be recrystallized to monocrystalline silicon.

As indicated in FIG. 3, the amorphous silicon region can be recrystallized by high temperature anneal at 1000° C. in an inert ambient.

In an exemplary embodiment of the invention, a 4H—SiC wafer was subjected to argon implantation (dose=1e15 cm$^{-2}$; energy=30 keV) using the method of the invention described above. Subsequently, the wafer was dipped in hot HNO$_3$ for 30 minutes to remove carbon from the ion-implanted region. The wafer was then characterized using X-ray photoelectron spectroscopy (XPS) to find out the composition in implanted and unimplanted regions. XPS showed that the unimplanted region of the wafer was unchanged and essentially SiC whereas the implanted region showed a reduction in carbon content, that the region is predominantly Si; and most of the carbon present in the implanted region was in the form of hydrocarbon and not as SiC. Thus, according to the invention, it is possible to selectively remove carbon from SiC wafers to obtain Si rich islands or regions. In the structures of the invention, the Si areas are used for fabrication of high-speed low voltage logic devices. In this respect, the use of silicon is beneficial because of the high inversion layer mobility of Si compared to SiC. The remaining SiC area is used to fabricate high voltage and high-current power devices. The result is a highly efficient monolithic IC which has the speed of Si low voltage devices and the power handling capability of SiC.

Figure 1:
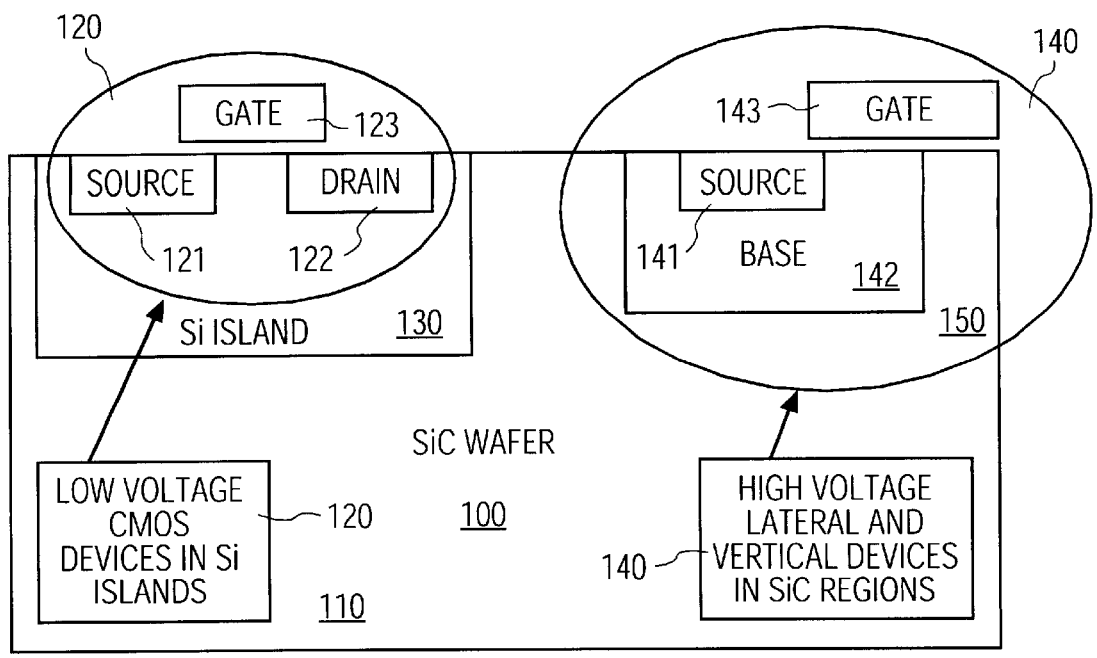
FIG. 1 is a schematic representation of a novel SiC semiconductor integrated circuit of the invention.
Figure 2:
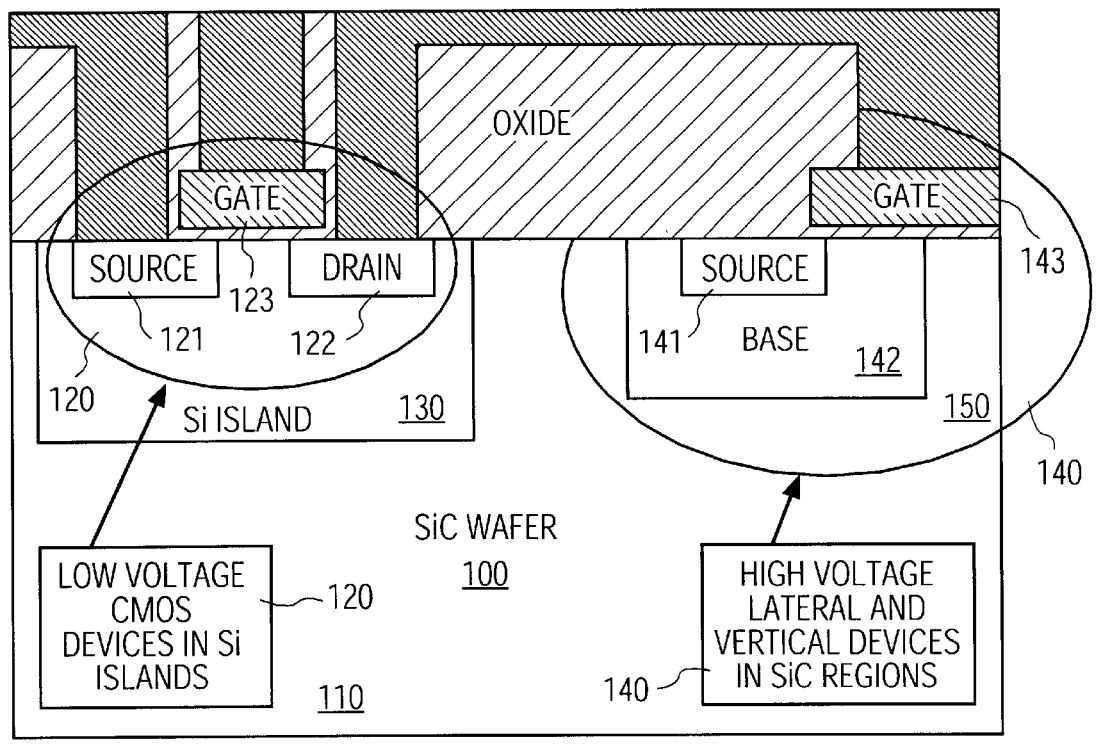
FIG. 2 is similar to FIG. 1 and illustrates metal interconnects for the high and low voltage devices.

With reference to FIGS. 1 and 2, there is shown a device in which according to the invention, a region of a SiC wafer 100 is amorphized, etched and annealed to form a selected region of Si. Subsequently, the region is processed with suitable doping and masking steps, and such other steps as may be necessary or desired, to form a low voltage CMOS device 120 having a source region 121, a drain region 122, and a gate region 123 formed in a monocrystalline silicon region 130 on a monocrystalline silicon carbide substrate 110 of the wafer 100. Either prior to such processing of the silicon region, or simultaneously therewith, or subsequently thereto, the wafer is further processed with suitable doping and masking steps, and such other steps as may be necessary or desired, to form a high voltage lateral and/or vertical device 140 which also comprises a source region 141, a base region 142, and a gate region 143 formed in monocrystalline SiC regions 150 of the SiC wafer 100. As illustrated in FIG. 2, the low and high voltage devices may be interconnected by means well known in the art, for example by metallization so that for example, the drain of the low voltage MOS device is connected to the gate of the high voltage transistor.

In a preferred embodiment, for example, a low voltage MOSFET (CMOS) 120 is implemented in a silicon island or region of a silicon carbide wafer 100 and connected to a high voltage depletion device 140 which is implemented in a silicon carbide region 150 of the silicon carbide wafer 100.

It will be appreciated by those skilled in the art from the preceding description that the invention contemplates the formation in said silicon region of a low voltage semiconductor device using techniques well known in the art, and that such device may be, for example, selected from MOSFET devices, BiCMOS devices, Bipolar devices, and combinations of such devices in the same or different silicon regions of the silicon carbide substrate, and also contains on the same chip, at least one silicon carbide region in which may be fabricated a high voltage (i.e., >1000V) semiconductor device using techniques well known in the art, and that such device may be, for example, selected from LDMOSFET, UMOSFET, DMOSFET, IGBT, MESFET, and JFET devices and combinations of such devices.

Figure 4:
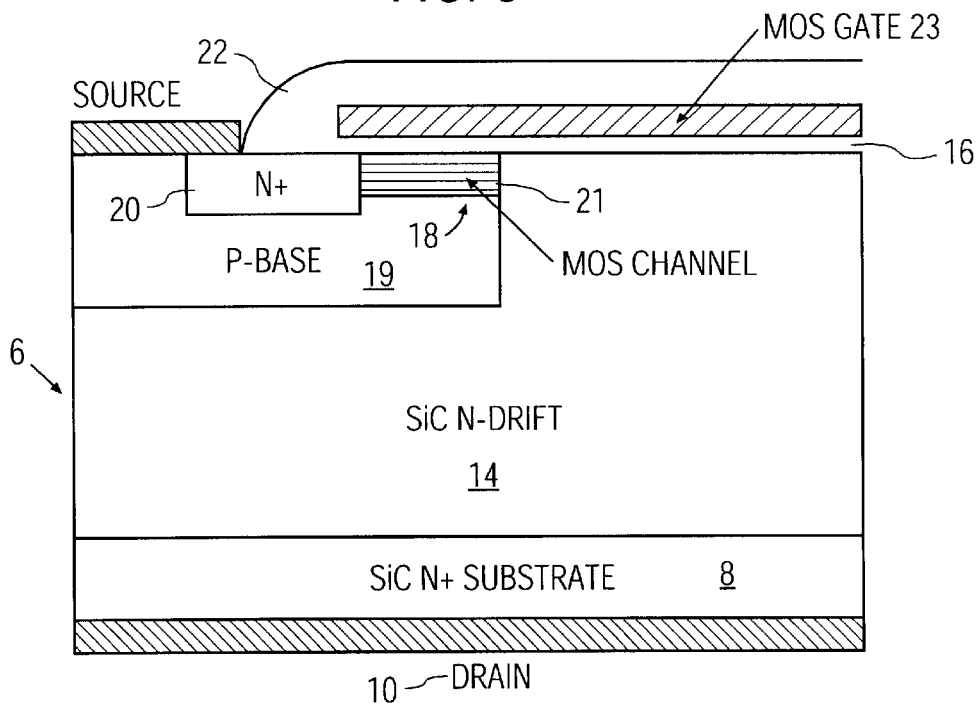
FIG. 4 is a schematic representation of a representative high voltage component of a semiconductor device of the invention.

A representative MOSFET may have a structure as illustrated in FIG. 4 and may be produced according to the method of the copending application Ser. No. 09/464,862, wherein there is illustrated a device 6 having a monocrystalline silicon carbide substrate 8 of a first conductivity type (preferably N+) which includes a N-type region 14. Appropriate dopant ions of second conductivity type are implanted to form the base region 19 of the semiconductor device. A second ion implantation with masking is performed to implant dopant ions of a first conductivity type, of preferably N+ type, region 20. The ion implantation step includes the steps of masking a second area on the face 16 and of patterning a mask so as to define the length of a channel 21. The region 20 corresponds to the source of the region of the field effect transistor to be formed. It will be obvious to those skilled in the art that the various ion implantation and doping steps may be performed in any order and may include an annealing step(s) to effectively activate the dopant ions. After the base region 19 and the source region 20 have been formed, an amorphizing step is performed to define amorphous region 18 in which ions are implanted with masking to form amorphous silicon carbide. In some cases the implanted and dopant ions may the same or different ions. The face 16 is then etched with appropriate etchant to remove carbon and to convert the amorphous silicon carbide areas including the area containing the channel 21 to amorphous silicon areas on a monocrystalline silicon carbide substrate 6. The amorphous silicon areas are then subjected to high temperature thermal anneal to convert the areas of amorphous silicon to form monocrystalline silicon regions in the monocrystalline silicon carbide substrate as desired. Thereafter or simultaneously, an insulating region 22 such as silicon oxide is formed on the face 16 using thermal oxidation. A gate conductive layer 23 is then deposited and patterned on the insulating region 22. The gate which preferably comprises polycrystalline silicon, is deposited and patterned on the insulating region using conventional techniques. The gate is preferably covered by the insulating region and the insulating region is patterned to provide a contact to the base and source. The contact metal (not shown) for providing contact to the source region and electrically connecting the source region to the base region is then deposited using conventional techniques. A drain metallization layer 10 is then applied on the back side of the substrate to complete the transistor fabrication. In such a device, the gate (23) and source (20) terminals are at the top surface and the drain terminal (10) is at the bottom. The carrier flow path is from the top source electrode (20), through the lateral channel (21) underneath the gate electrode (23), then vertically through the drift region (14) and N+ substrate (8), to the drain electrode (10).

While this invention has been described with reference to the illustrative embodiments, It will be appreciated by those skilled in the art that in the drawings and specification, there have been disclosed typical preferred embodiments of the invention and, although specific terms are employed, they are not used for purposes of limitation, the scope of the invention being set forth in the appended claims.

I claim:

1. A method for fabricating silicon regions in a silicon carbide wafer which comprises the steps of
    amorphizing at least one region of a monocrystalline silicon carbide wafer to convert a substantial portion of the monocrystalline silicon carbide in said region to amorphous silicon carbide;
    removing an effective amount of the carbon from said amorphous silicon carbide region with an etchant effective to selectively remove a substantial proportion of carbon from said amorphous silicon carbide to produce an amorphous silicon region; and
    converting said amorphous silicon region to a crystalline silicon region on the monocrystalline silicon carbide wafer.

2. A method as claimed in claim 1, comprising the additional steps of forming a low voltage semiconductor device in said monocrystalline silicon region of said monocrystalline silicon carbide wafer.

3. A method as claimed in claim 1, comprising the additional steps of forming a high voltage semiconductor device in a silicon carbide region of said monocrystalline silicon carbide wafer.

4. A method as claimed in claim 3, comprising the additional steps of forming a low voltage semiconductor device in said monocrystalline silicon region of said monocrystalline silicon carbide wafer.

5. A method as claimed in claim 4, wherein said high and low voltage devices are formed simultaneously in the respective regions of said monocrystalline silicon carbide wafer.

6. A method as claimed in claim 4, wherein said high and low voltage devices are formed sequentially in the respective regions of said monocrystalline silicon carbide wafer.

7. A method for fabricating a silicon carbide wafer having a low voltage and a high voltage semiconductor device in respective regions thereof which comprises the steps of:
    providing a SiC wafer;
    amorphizing at least one region of said wafer to produce at least one amorphous silicon carbide region;
    selectively removing an effective amount of carbon from at least a portion of said at least one amorphous silicon carbide region by the action of an etchant which selectively etches carbon to form at least one amorphous silicon region;
    converting said at least one amorphous silicon region to a crystalline silicon region;
    forming a low voltage semiconductor device in said crystalline silicon region; and
    forming a high voltage semiconductor device in a silicon carbide region of said SiC wafer.

8. A method as claimed in claim 7, wherein said high and low voltage devices are formed simultaneously in the respective regions of said SiC wafer.

9. A method as claimed in claim 7, wherein said high and low voltage devices are formed sequentially in the respective regions of said SiC wafer.

* * * * *